United States Patent [19]

Sato et al.

[11] Patent Number: 4,747,608
[45] Date of Patent: May 31, 1988

[54] WAFER CHUCK

[75] Inventors: Mitsuya Sato, Yokohama; Nobuyoshi Deguchi, Yamatoshi; Shunzo Imai, Yamato, all of Japan

[73] Assignee: Canon Kabushiki Kaisha, Tokyo, Japan

[21] Appl. No.: 792,584

[22] Filed: Oct. 29, 1985

[30] Foreign Application Priority Data

Oct. 30, 1984 [JP] Japan ................................ 59-228380
Jul. 12, 1985 [JP] Japan ................................ 60-152373
Jul. 12, 1985 [JP] Japan ................................ 60-152374

[51] Int. Cl.$^4$ ............................................. B23B 31/00
[52] U.S. Cl. ........................................ 279/1 E; 279/3
[58] Field of Search ..................... 279/1 E, 3; 51/362, 51/215 UE, 235; 269/21; 248/362; 29/426.5, 539; 414/74, 417, 331; 249/68, 75, 67, 69; 425/444, 438, 436 R, 554, 556

[56] References Cited

U.S. PATENT DOCUMENTS

| | | | |
|---|---|---|---|
| 2,304,899 | 12/1942 | Dupre | 249/67 |
| 3,740,900 | 6/1973 | Youmans et al. | 51/235 |
| 3,977,566 | 8/1976 | Hill et al. | 414/331 |
| 4,311,427 | 1/1982 | Coad et al. | 414/417 |
| 4,448,403 | 5/1984 | Riessland et al. | 279/3 |

FOREIGN PATENT DOCUMENTS

1801989 6/1970 Fed. Rep. of Germany ...... 425/444

Primary Examiner—Z. R. Bilinsky
Attorney, Agent, or Firm—Fitzpatrick Cella, Harper & Scinto

[57] ABSTRACT

A wafer chuck for releasably holding a wafer, includes a base member having an upper surface for carrying and holding thereon the wafer, a lift mechanism operative on the wafer when it rests on the base member to move the wafer relative to the base member in a direction away from the base member, the lift mechanism having an operative member extending substantially in a direction to a radially inward position from a radially outward position of the base member, the operative member having an end portion movable, relative to the base member, between a first position at which it is retracted from the upper surface of the base member and a second position at which it is protrudent from the upper surface of the base member so as to engage with the wafer to move the same relative to the base member, and driving means for moving, relative to the base member, the end portion of the operative member between the first and second positions.

8 Claims, 8 Drawing Sheets

WAFER CHUCK

FIELD OF THE INVENTION AND RELATED ART

This invention relates to a wafer chuck usable in the field of manufacture of semiconductor devices such as integrated circuits, for holding a semiconductor wafer.

In the field of manufacture of semiconductor devices, various apparatuses such as alignment and exposure apparatuses, resist coaters, wafer probers, etc. are used. In these apparatuses, to perform various operations such as an exposure operation, a resist coating operation, a probing operation, etc., a wafer is held by a wafer chuck. After completion of the operation, the wafer is unloaded from the chuck.

It is therefore desirable that the wafer chuck has a mechanism which not only assures positive and stable holding of the wafer but also ensures facile wafer loading/unloading.

There have already been proposed and developed various types of wafer chucks which may be generally classified into three types, a Bernoulli type, an air conveyance type and a wafer lift type.

The wafer chucks of the Bernoulli type are arranged such that an air is flown over the surface of the wafer so that a negative pressure is established on the wafer surface, whereby the wafer is floated. In this type of wafer chuck, however, a mass of air must be blown to the surface of the wafer. Therefore, there is a high possibility that dust or any foreign particles are adhered to the wafer surface. This is undersirable The wafer chucks of the air conveyance type are arranged such that the wafer is floated by means of air as in the foregoing case and, additionally, an air flow which is supplied from a separate air blowing device is applied to the floating wafer to move the wafer out of the wafer chuck. In this case, the position of the wafer is unstable. So, the positioning of the wafer must be effected before it is moved back into a wafer cassette for storing the wafer.

In the wafer chucks of the wafer lift type, the wafer is lifted up from the wafer chuck by means of a lift mechanism and then a wafer hand is introduced to the back side of the wafer in order to take out the wafer from the chuck. In this type of wafer chucks, the lift mechanism is provided within the chuck, which leads to complexity of the internal structure of the wafer chuck. Also, as regards the wafer probers, for example, it is necessary to maintain a constant electric potential in the wafer being examined, during the examination of electric characteristics of each of the chips on the wafer, in order to assure accurate measurement. For this purpose, it is desired to electrically isolate the wafer chuck from any external components. With the wafer lift type, however, the lift mechanism included in the internal structure of the wafer chuck leads to an obstruction to the provision of an electrically insulating member. Further, where it is necessary to control the temperature of the wafer chuck in view of thermal expansion/contraction of the wafer, the existence of the lift mechanism makes it difficult to control the temperature so as to maintain a uniform temperature distribution.

SUMMARY OF THE INVENTION

It is accordingly a primary object of the present invention to provide a wafer chuck which is free from the above-described problems and which assures facile wafer loading/unloading with a simple structure.

To achieve this object, there is provided, according to an aspect of the present invention, a wafer chuck for releasably holding a wafer, including a base member having an upper surface for carrying and holding thereon the wafer, a lift mechanism operative on the wafer when it rests on the base member to move the wafer relative to the base member in a direction away from the base member, the lift mechanism having an operative member extending substantially in a direction to a radially inward position from a radially outward position of the base member, the operative member having an end portion movable, relative to the base member, between a first position at which it is retracted from the upper surface of the, base member and a second position at which it protrudes from the upper surface of the base member so as to engage with the wafer to move the same relative to the base member, and driving means for moving, relative to the base member, the end portion of the operative member between the first and second positions.

Briefly, the wafer chuck according to the above-described aspect of the present invention corresponds to an improbed form over conventional wafer lift type wafer chucks and includes a wafer lift mechanism of simple struture, which comprises a lever member in one preferred embodiment, adapted for facile wafer loading/unloading to and from the wafer chuck.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 1:
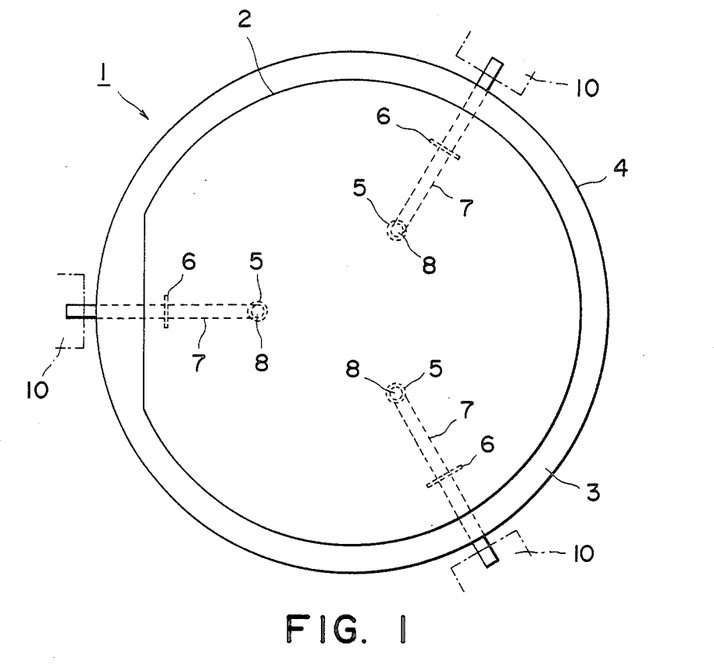
FIG. 1 is a schematic plan view of a wafer chuck according to a first embodiment of the present invention.
Figure 2:
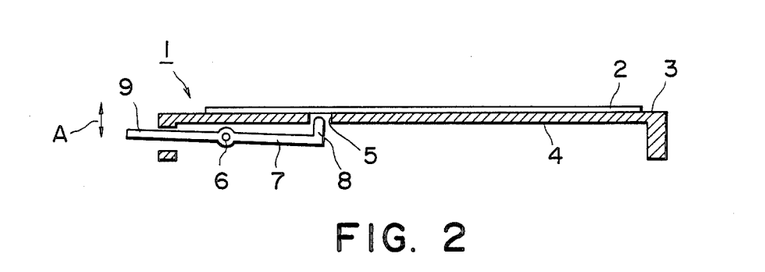
FIG. 2 is a schematic sectional view of the wafer chuck of FIG. 1.

Referring now to the drawings, FIG. 1 is a plan view of a wafer chuck, denoted generally at 1, according to a first embodiment of the present invention. FIG. 2 is a sectional view of the wafer chuck 1. As shown in these Figures, the wafer chuck 1 includes a base member 4 having an upper surface 3 for carrying and holding thereon a wafer 2. The base member 4 has formed therein three throughbores 5 located equiangularly with respect to the center of the base member 4, i.e. in a 120-degree angular relation with respect to the center of the base member 4. Although not shown in the drawings, the base member 4 is also provided with a number of throughbores for applying vacuum supplied from an unshown vacuum source to the lower surface of the wafer 2 when it rests on the upper surface of the base member 4, to hold the wafer 2 thereon by vacuum suction.

Disposed under the lower surface of the base member 4 are three lever members 7 each of which is pivotable about a fulcrum 6. As is best seen in FIG. 1, the lever members 7 are disposed in an equiangular relation with respect to the center of the base member 4 and extend radially from the outside of the base member 4 to the inside of the same. Each lever member 7 has an end portion 8 engageable with the lower surface of the wafer 2 resting on the base member 4 and another end portion 9 engageable with an urging portion 10 of a wafer hand (denoted by a phantom line in FIG. 1). The end portion 8 is normally at a position beyond downwardly from the upper surface 3 of the base member 4, i.e. at a position retracted from the upper surface 3 of the base member 4. When the end portion 9 is pressed downwardly by an associated one of the urging portions 10 of the wafer hand, the lever member 7 is pivotally moved about the fulcrum 6 so that the end portion 8 protrudes upwardly beyond the upper surface 3 of the base member 4, through an associated one of the throughbores 5. By this, the wafer 2 is lifted and, therefore, a space is formed between the lower surface of the wafer 2 and the upper surface 3 of the base member 4, facilitating unloading of the wafer 2 from the wafer chuck 1.

Figure 3:
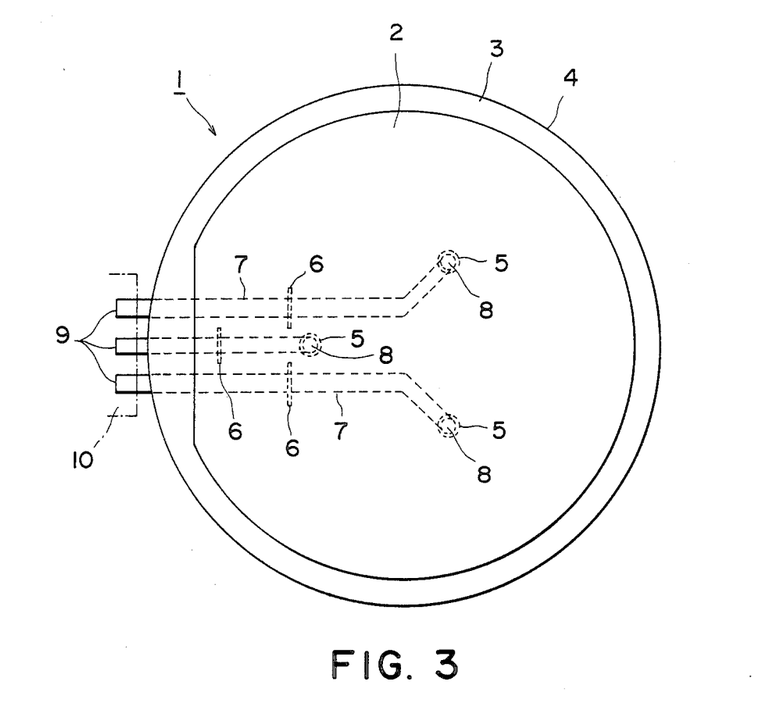
FIG. 3 is a schematic plan view of a wafer chuck according to a second embodiment of the present invention.

FIG. 3 is a plan view of a wafer chuck according to a second embodiment of the present invention. Similarly to the wafer chuck of the first embodiment shown in FIG. 1, the wafer chuck of the present embodiment includes a base member 4 having an upper surface 3 for carrying and holding thereon a wafer 2. Also, like the first embodiment, the base member 4 has formed therein three throughbores 5 located in a 120-degree angular relation with respect to the center of the base member 4. As in the FIG. 1 embodiment, the base member 4 of the present embodiment is provided with a number of throughbores (although not shown in the drawing) for applying vacuum supplied from an unshown vacuum source to the lower surface of the wafer 2 when it rests on the upper surface 3 of the base member 4, to hold the wafer 2 thereon by vacuum suction.

Disposed below the lower surface of the base member 4 are three lever members 7. While, in the FIG. 1 embodiment, the lever members 7 are disposed in a 120-degree angular relation with the respect to the center of the base member 4 with each member extending radially, the lever members 7 of the present embodiment are disposed in a juxtaposed relation such as shown in FIG. 3. More particularly, each of two outward ones of the lever members 7 has a length longer than that of an intervening middle one, and includes a bent portion such as shown in FIG. 3.

Each of the lever members 7 has an end portion 8 engageable with the lower surface of the wafer 2 resting on the upper surface 3 of the base member 4 and another end portion 9 engageable with a single urging portion 10 of a wafer hand (denoted by a phantom line in FIG. 3). The end portion 8 of each of the lever members 7 is normally at a position retracted from the upper surface 3 of the base member 4. When the end portions 9 of the lever members 7 are pressed downwardly by the common urging portion 10 of the wafer hand, the lever members 7 are pivotally moved about their own fulcrums 6 so that their end portions 8 protrude beyond the upper surface 3 of the base member 4 through respective throughbores 5. By this, the wafer 2 is lifted upwardly from the base member 4 and, therefore, a space is formed between the lower surface of the wafer 2 and the upper surface 3 of the base member 4, facilitating unloading of the wafer 2 from the wafer chuck 1.

According to the first and second embodiments described in the foregoing, the wafer can be lifted away from the wafer chuck base by a combination of lever members each extending from the outside to the inside of the wafer chuck through a certain distance, and the driving source for actuating the wafer lifting mechanism is provided outside the wafer chuck. Therefore, the problem of complexity in the internal structure of the wafer chuck is obviated. Also, the wafer carrying member can be made of a flat plate, so the temperature control for maintaining a uniform temperature distribution is easy to achieve.

Figure 4:
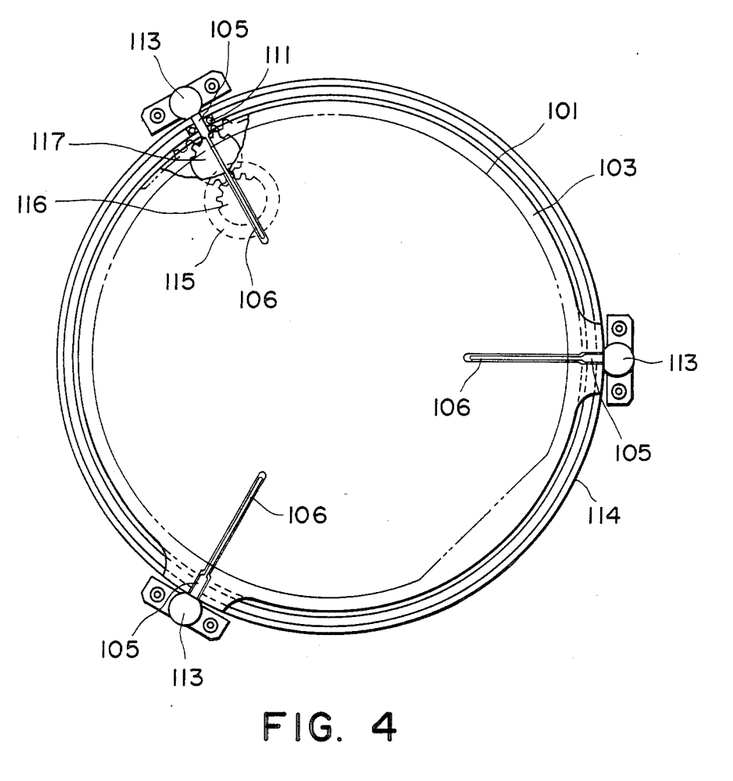
FIG. 4 is a plan and partially broken view schematically showing a wafer chuck according to a third embodiment of the present invention.
Figure 5A:
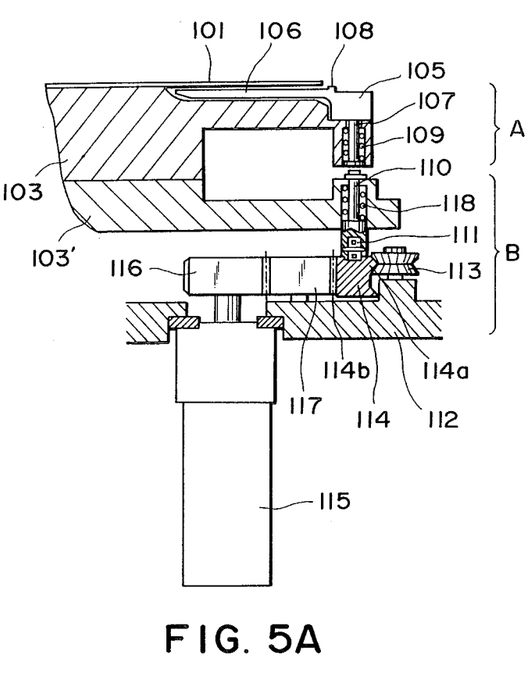
FIG. 5A is an enlarged fragmentary sectional view of the wafer chuck of the FIG. 4 embodiment, wherein a lift member is at its lowermost position.
Figure 5B:
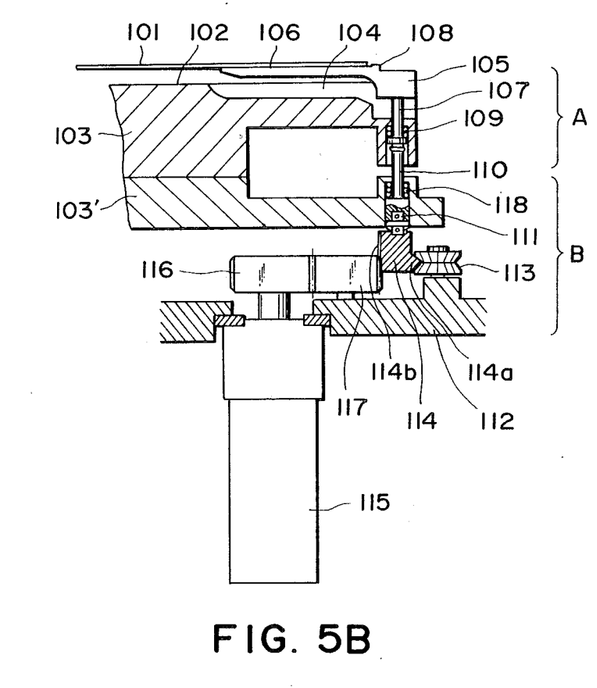
FIG. 5B is a view similar to FIG. 5A, but the lift member is at its uppermost position.

Referring now to FIGS. 4-5B, a wafer chuck according to a third embodiment of the present invention will be described.

As is best seen in FIG. 5A, the wafer chuck of this embodiment is essentially composed of a base portion, generally denoted at reference A, for carrying and holding thereon a wafer 101 and a stage portion, generally denoted at reference B, for supporting the base portion A. The base portion A includes three lift members each having a fork 105, etc., while the stage portion B includes lift driving means for moving each of the forks 105 upwardly or downwardly relative to a base member 103 of the base portion A.

In the base portion A, the base member 103 which is one of the major component of the wafer chuck has an unshown chucking mechanism disposed therewithin and also has an upper flat surface 102 for carrying thereon the wafer 101. The base member 103 has three elongated grooves 104 extending radially inwardly from the outer periphery of the upper surface 102 of the base member 103 and located equiangularly, as viewed in FIG. 4, with a unit angle of 120 degrees with respect to the center of the base member 103. At one end of each of the grooves 104, corresponding one of the forks 105 is supported for upward and downward movement. Normally, each of the forks 105 is at its lowermost position at which it is accommodated in an associated one of the grooves 104 of the base member 103, so that the upper surface of the fork 105 is substantially coplanar with the upper surface 102 of the base member 103 or, alternatively, is slightly lower than the upper surface 102 of the base member 103, as viewed in FIG. 5A.

Each of the lift members includes the fork 105 as aforesaid having an elongated arm 106 whose upper surface is adapted to support the lower surface of the wafer 101 when the latter is to be lifted by the lift members, a shaft 107 coupled to the fork 105 and journaled by the base member 103, a spring 109 for applying a downward bias force to the shaft 107 so as normally to hold the arm 106 at its lowermost position, and a protrusion 108 formed on the upper surface of the fork 105 and serving as a position guide for the outer periphery of the wafer 101. The fork 105 can be moved upwardly to its uppermost position when the lower end of the shaft 107 is pressed upwardly against the bias of the spring 9. By releasing such upwardly pressing force, the fork 105 is moved downwardly to its lowermost position by the bias force of the spring 109.

The upward and downward movement of the forks 105 are achieved by the lift driving means of the stage portion B which will be described below.

Denoted at 103' in FIG. 5A is a member which is supported by a stage 112 by means of an unshown support mechanism and which is arranged to support the base member 103. A push rod 110 opposing to the lower end of the shaft 107 of the fork 105 is journaled by the member 103'. The push rod 110 is normally urged downwardly by a spring 118, so that, when the fork 105 is its lowermost position, a gap or spacing is preferably defined between the lower end of the shaft 107 and the upper end of the push rod 110 to separate them from each other. Mounted onto the lower end of the puch rod 110 are bearings 111 which are in contact with a helicoid ring 114 with a low coefficient of friction. The combination of above-described elements 110, 111 and 118 is provided for each of the three lift members, although only one is illustrated in FIG. 5A.

The holding ring 114 is provided in order to drive the three push rods 110, as will be described later, and has helicoidal threads 114a formed on its outer peripheral surface and internal gear teeth 114b formed on its inner peripheral surface. The helicoid ring 114 is rotatably supported by three V-rollers 113 each having a V-shaped peripheral groove. Each of the V-rollers 113 is rotatably supported by the stage 112 with its rotational axis being inclined in accordance with the inclination of the helicoidal threads 114a of the helicoid ring 114.

The internal gear 114b of the helicoid ring 114 is drivingly connected via an internal gear 117 to a driving gear 116. The driving gear 116 is connected to an output shaft of a motor 115. Thus, forward or reverse rotation of the driving gear 116 caused by the motor 115 causes forward or reverse rotation of the helicoid ring 114. During such forward or reverse rotation, the helicoid ring 114 is also translated upwardly or downwardly in accordance with the direction of rotation thereof, by means of a co-operative arrangement of the V-rollers 113 and the helicoidal threads 114a. When the helicoid ring 114 is moved upwardly by the rotation thereof in a particular direction, the upward movement of the helicoid ring 114 is transmitted to each of the push rods 110 by way of the bearings 111, thereby to move the push rods 110 upwardly. The upward movement of each push rod 110 first brings its upper end into abutment with the lower end of the shaft 107 of corresponding one of the forks 105, and then pushes the shaft 107 upwardly. By this, each of the forks 105 is moved upwardly such as shown in FIG. 5B, whereby the wafer 101 is lifted upwardly from the upper surface 102 of the base member 103. Accordingly, a space is formed between the lower surface of the wafer 101 and the upper surface 102 of the base member 103. After the forks 105 are moved to their uppermost positions, such as shown in FIG. 5B, an unshown wafer hand is introduced into the space formed between the wafer 101 and the base member 103, and the wafer 101 is unloaded from the wafer chuck. The loading of the wafer can be performed by effecting the above-described operations in a reverse order.

Figure 6A:
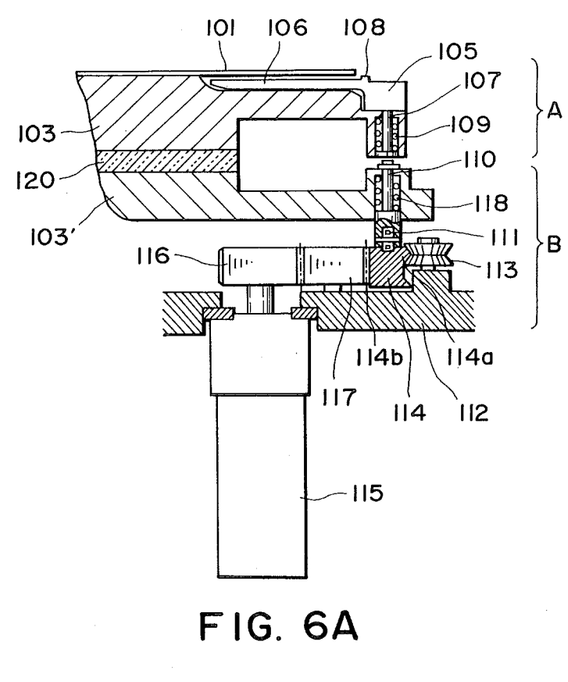
FIG. 6A is an enlarged fragmentary sectional view of a wafer chuck according to a fourth embodiment of the present invention, wherein a lift member is at its lowermost position.
Figure 6B:
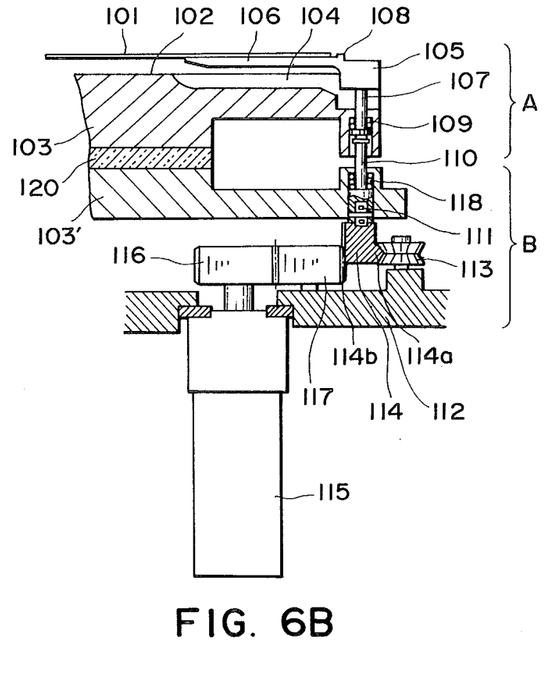
FIG. 6B is a view similar to FIG. 6A, but the lift member is at its uppermost position.

FIGS. 6A and 6B show a wafer chuck according to a fourth embodiment of the present invention, which is a modification of the third embodiment described with reference to FIGS. 4–5B. Since the wafer chuck of the present embodiment includes elements substantially the same as those of the preceding embodiment, description of like elements will be omitted here only for the sake of simplicity of explanation, by assigning the same reference numerals to corresponding elements.

Chiefly, in the present embodiment, it is intended to assure electrical isolation of the wafer resting on the wafer chuck, as required particularly in the case of wafer probers. To achieve the electrical isolation of the wafer 101 resting on the base member 103 of the wafer chuck, a gap or spacing is maintained between the shaft 107 of each of the forks 105 and an associated one of the push rods 110 so that they are sufficiently separated from each other, when the fork 105 is at its lowermost position, as in the preceding embodiment shown in FIGS. 5A and 5B. In addition thereto, according to the present embodiment shown in FIGS. 6A and 6B, an insulating plate 120 made of an appropriate material such as ceramic, etc. is interveningly provided between the base member 103 and the member 103'. With this arrangement, the base portion A for carrying the wafer 101 can be insulated or isolated from the stage portion B electrically and also thermally. It is to be noted here that the electrical and thermal insulation is not at all broken or obstructed because the lift mechanism is composed of two separated portions, and that positive isolation of the base portion A from the stage portion B is assured only by the intervention of a simple insulating plate member.

While, in the above two embodiments, each fork 105 is urged upwardly from the stationary base member 103 by means of the helicoid ring and by way of the push rod 110, the helicoid ring may be replaced by a suitable cam mechanism. Substantially the same function is attainable.

Figure 7:
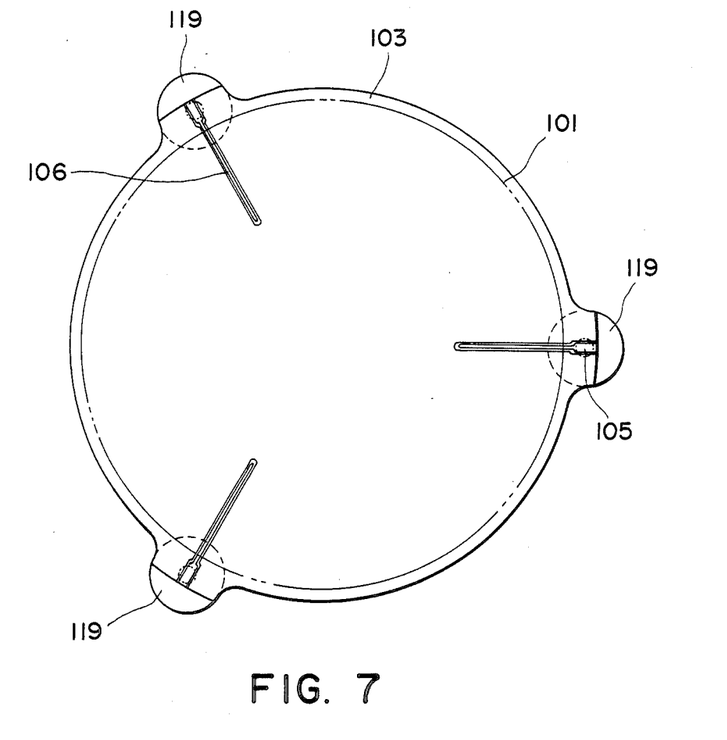
FIG. 7 is a schematic plan view of a wafer chuck according to a fifth embodiment of the present invention.
Figure 8A:
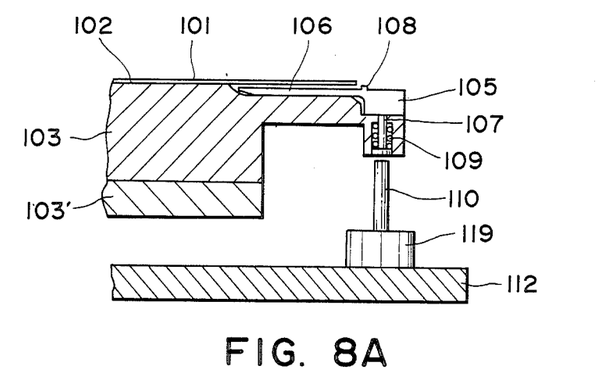
FIG. 8A is an enlarged fragmentary sectional view of the wafer chuck of the FIG. 7 embodiment, wherein a lift member is at its lowermost position.
Figure 8B:
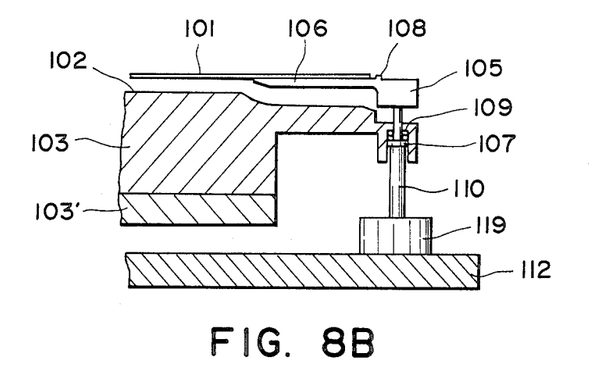
FIG. 8B is a view similar to FIG. 8A, but the lift member is at its uppermost position.

In an event that the base member 103 is movable upwardly and downwardly, each of the push rods 110 may be fixedly secured to the stage portion B. That is, during downward movement of the base member 103, the downward movement of each of the forks 105 is blocked by the abutment with the corresponding push rod 110, as a result of which the fork 105 is lifted relative to the upper surface of the downwardly moving base member 103. Such modification is preferable in the point that separate driving means, such as the motor 115 shown in FIG. 6A, as the drive source for moving the fork mechanism can be omitted and the driving mechanism for moving the base member upwardly and downwardly can be used also as the drive source for the wafer lifting operation. Such arrangement is illustrated in FIGS. 7–8B, as a fifth embodiment of the present invention.

Since the present embodiment may be considered as a modification of the preceding embodiment described with reference to FIGS. 6A and 6B, description of like elements will be omitted here only for the sake of simplicity of explanation, by assigning the same reference numerals to corresponding elements. Denoted at numerals 119 - 119 in FIGS. 7–8B are elements for-fixedlly securing the puch rods 110 to a stage 112, respectively.

Upon loading/unloading of the wafer 101, the base member 103 is moved dowwardly by an unshown base driving mechanism. By this downward movement of the base member 103, the lower end of the shaft 107 of each of the forks 105 is brought into abutment with the upper end of an associated one of the stationary push rods 110. As a result, further downward movement of the forks 105 is blocked. Thus, the forks 105 now lift the wafer 101 relative to the upper surface 102 of the downwardly moving base member 103, such as shown in FIG. 8B.

Since the upward and downward movement of the forks relative to the upper surface 102 of the base member 103 can be achieved without provision of an additional drive source. So, where the wafer chuck inherently contains a mechanism for moving the base member upwardly and downwardly such as in the case of wafer probers, further simplification of the structure is attainable with this type of the wafer chuck.

Figure 9:
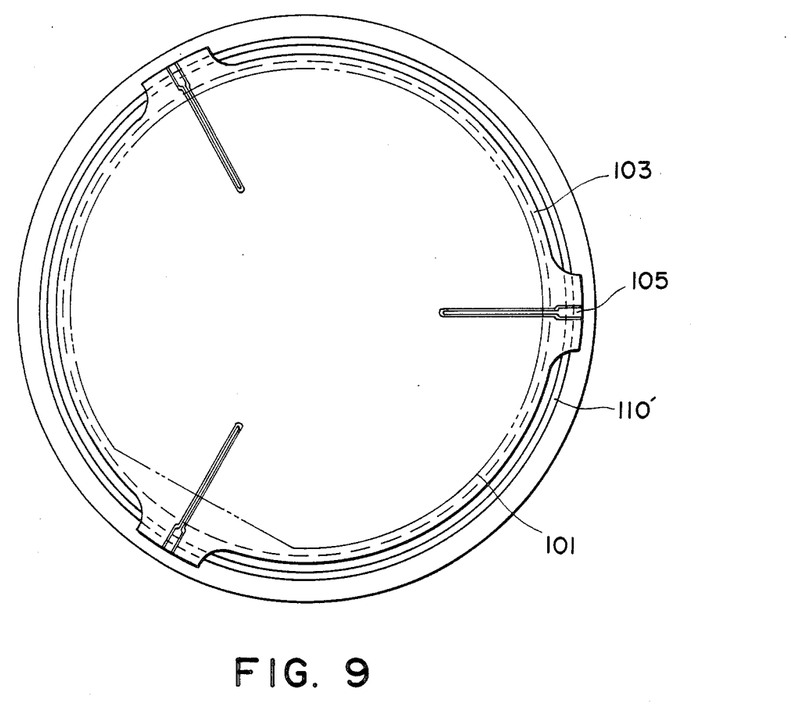
FIG. 9 is a schematic plan view of a wafer chuck according to a sixth embodiment of the present invention.

While in this embodiment, three push rods 110 and three fixing elements 119 are disposed in an equiangular relation with respect to the center of the base member 103, as viewed in FIG. 7, this is not limitative. For example, as illustrated in FIG. 9 showing a wafer chuck according to a sixth embodiment of the present invention, the three push rods 110 may be replaced by a single circumferentially extending push ring 110′ which is disposed so as to encircle the base member 103. The push ring 110′ is arranged such that, when the base member 103 is moved downwardly, the upper edge of the push ring 110′ is brought into abutment with the lower end of the shaft 107 (see FIGS. 8A and 8B) of each of the forks 105. This arrangement assures that, for any rotational position of the base member 103, only the downward movement of the base member 103 effectively causes the lifting of the wafer 101 by the forks 105.

In accordance with the third to sixth embodiments of the present invention as described in the foregoing, the wafer lift mechanism is essentially composed of two portions. This is very preferable because it allows provision of the lift driving source at a position outside the wafer chuck or it permits any elevation mechanism inherently contained within the wafer chuck to be used also as the lift driving source. Accordingly, only the follower elements of the lift mechanism have to be incorporated into the base portion of the wafer chuck. This effectively obviates the complexity in the internal structure of the wafer chuck. Also, according to these embodiments of the present invention, the base portion and the stage portion of the lift mechanism can be isolated from each other when the lift mechanism is in its inoperative state. Therefore, the electrical and/or thermal isolation of the base member of the wafer chuck is attainable only by the intervention of a simple insulating later. The structure itself of the lift mechanism does not interfere the insulation. Further, according to the present invention as has hitherto been described, the wafer carrying surface of the wafer chuck is formed with elongated grooves only, and the elongated levers or arms of the forks are fully accommodated in respective grooves. As a result, satisfactory flatness is attainable over the entire area of the wafer carrying surface. So, any deterioration of the flatness of the wafer and unpreferable damage of the wafer due to any local and external force can be prevented.

While the invention has been decribed with reference to the structures disclosed herein, it is not confined to the details set forth and this disclosure is intended to cover such modifications or changes as may come within the purposes or the scope of the following claims.

What is claimed is:

1. A wafer chuck for releasably holding a wafer, comprising:
    a base member having an upper surface for carrying and holding thereon the wafer;
    a lift mechanism operative on the wafer when it rests on said base member to move the wafer relative to said base member in a direction away from said base member, said lift mechanism having a plurality of operative members, each extending substantially from a radially outward position to a radially inward position of said base member, said plurality of operative members being disposed along lines that substantially evenly divide said base member into a plurality of portions corresponding in number to said plurality of operative members, each of said operative members having an end portion movable, relative to said base member, between a first position at which it is retracted from the upper surface of said base member and a second position at which it protrudes from the upper surface of said base member so as to engage the wafer to move the same relative to said base member, wherein said operative members have other end portions which are collectively disposed adjacent to a predetermined portion; and
    driving means for moving, relative to said base member, the end portion of each of said operative members between said first and second positions, wherein said driving means is disposed so as to be operationally associated with the collectively disposed end portions of said operative members.

2. A wafer chuck according to claim 1, wherein said wafer chuck includes three operative members that substantially evenly divide said base member into three portions.

3. A wafer chuck according to claim 1, wherein each of said plurality of operative members of said lift mechanism is normally isolated from said driving means by a gap.

4. A wafer chuck for releasably holding a wafer, comprising:
    a base member having an upper surface for carrying and holding thereon the wafer, said base member having a plurailty of throughbores formed therethrough;
    a lift mechanism operative on the wafer when it rests on said base member to move the wafer relative to said base member in a direction away from said base member, said lift mechanism having a plurality of operative members, corresponding in number to said plurality of throughbores, each of said operative members extending substantially from a radially outward position to a radially inward position of said base member, said plurality of operative members being disposed along lines that substantially evenly divide said base member into a plurality of portions corresponding in number to said plurality of operative members, each of said operative members having an end portion movable, relative to said base member, between a first position at which it is retracted from the upper surface of said base member and a second position at which it protrudes from the upper surface of said base member through a respective throughbore so as to engage the wafer to move the same relative to said base member, wherein said operative members have other end portions which are collectively disposed adjacent to a predetermined portion; and driving means for moving, relative to said base member, the end portion of each of said operative members between said first and seoond positions, wherein said driving means is disposed so as to be operationally associated with the collectively disposed end portions of said operative members.

5. A wafer chuck according to claim 4, wherein said base member has three throughbores and wherein said wafer chuck includes three operative members that substantially evenly divide said base member into three portions.

6. A wafer chuck for releasably holding a wafer, comprising:

a base member having an upper surface for carrying and holding thereon the wafer;

a left member supported by said base member for moving the wafer, carried by said base member, relative to said base member between a first position away from the upper surface of said base member and a second position at which an upper surface of said lift member is substantially coplanar with or retracted from the upper surface of said base member;

a stage for supporting said base member; and driving means disposed on said stage, for moving said lift member relative to said base member between said first and second positions, wherein said lift member includes a plurality of arms engageable with a lower surface of the wafer to move the wafer relative to said base member in a direction away from said base member, each of said arms of said lift member being normally isolated from said driving means by a gap, and wherein the upper surface of said base member has a plurality of recesses formed thereon, for substantially fully accommodating said arms of said lift member, respectively, when said lift member is at said second position.

7. A wafer chuck for releasably holding a wafer, comprising:

a base member having an upper surface for carrying and holding thereon the wafer;

a lift member supported by said base member for moving the wafer, carried by said base member, relative to said base member between a first position away from said base member and a second position at which an upper surface of said lift member is substantially coplanar with or restricted from the upper surface of said base member;

a stage for supporting said base member;

driving means disposed on said stage, for moving said lift member relative to said base member between said first and second positions, said driving means being isolated from said lift member when it is at said second position; and means for insulating said base member and said lift member from said stage and said driving means;

wherein said lift member includes a plurality of arms engageable with a lower surface of the wafer to move the same relative to said base member in a direction away from said base member, and wherein the upper surface of said base member has a plurality of recesses formed thereon, for substantially fully accommodating said arms of said lift member, respectively, when said lift member is at said second position.

8. A wafer chuck for releasably holding a wafer, comprising:

a base member having an upper surface for carrying and holding thereon the wafer;

a lift member supported by said base member for moving the wafer, carried by said base member, relative to said base member between a first position away from said base member and a second position at which an upper surface of said lift member is substantially coplanar with or retracted from the upper surface of said base member;

a stage for supporting said base member;

driving means disposed on said stage, for moving said lift member relative to said base member between said first and second positions, said driving means being isolated from said lift member when it is at said second position; and means for insulating said base member and said lift member from said stage and said driving means;

wherein said lift member is attached to said base member and wherein said base member is supported by said stage by way of said insulating means.

* * * * *

UNITED STATES PATENT AND TRADEMARK OFFICE
CERTIFICATE OF CORRECTION

PATENT NO. : 4,747,608            Page 1 of 2

DATED : May 31, 1988

INVENTOR(S) : MITSUYA SATO, ET AL.

It is certified that error appears in the above-identified patent and that said Letters Patent is hereby corrected as shown below:

COLUMN 1

Line 32, "undersirable" should read --undesirable.--.
    Line 46, "chucks," should read --chuck,--.
    Line 58, "obstraction" should read --obstruction--.

COLUMN 2

Line 16, "the, base" should read --the base--.
    Line 25, "improbed" should read --improved--.

COLUMN 3

Line 35, "beyond downwardly from" should read --below--.

COLUMN 4

Line 52, "component" should read --components--.

COLUMN 5

Line 32, "puch" should read --push--.

COLUMN 7

Line 7, "fixedlly" should read --fixedly--.
    Line 8, "puch" should read --push--.
    Line 10, "dowwardly" should read --downwardly--.
    Line 20, "Since the" should read --The--.
    Line 65, "interfere the" should read --interfere with the--.

UNITED STATES PATENT AND TRADEMARK OFFICE
CERTIFICATE OF CORRECTION

PATENT NO. : 4,747,608

DATED : May 31, 1988

INVENTOR(S) : MITSUYA SATO, ET AL.

It is certified that error appears in the above-identified patent and that said Letters Patent is hereby corrected as shown below:

COLUMN 8

Line 57, "plurailty" should read --plurality--.

COLUMN 9

Line 29, "left member" should read --lift member--.

COLUMN 10

Line 10, "restricted" should read --retracted--.

Signed and Sealed this

Tenth Day of January, 1989

*Attest:*

DONALD J. QUIGG

*Attesting Officer*     *Commissioner of Patents and Trademarks*